(12) United States Patent
Lim et al.

(10) Patent No.: US 7,626,258 B2
(45) Date of Patent: Dec. 1, 2009

(54) CAP WAFER, SEMICONDUCTOR CHIP HAVING THE SAME, AND FABRICATION METHOD THEREOF

(75) Inventors: Ji-hyuk Lim, Yongin-si (KR); Jun-sik Hwang, Yongin-si (KR); Woon-bae Kim, Yongin-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 71 days.

(21) Appl. No.: 11/657,056

(22) Filed: Jan. 24, 2007

(65) Prior Publication Data

US 2008/0067664 A1 Mar. 20, 2008

(30) Foreign Application Priority Data

Sep. 15, 2006 (KR) ...................... 10-2006-0089815

(51) Int. Cl.
 *H01L 23/12* (2006.01)
 *H01L 23/42* (2006.01)
(52) U.S. Cl. ................. 257/704; 257/774; 257/E23.181
(58) Field of Classification Search ................. 257/704, 257/774, E23.181
 See application file for complete search history.

(56) References Cited

U.S. PATENT DOCUMENTS 5,229,647 A * 7/1993 Gnadinger .................. 257/785
6,228,675 B1 * 5/2001 Ruby et al. .................. 438/106
7,060,526 B2 * 6/2006 Farnworth et al. .......... 438/106
7,449,355 B2 * 11/2008 Lutz et al. ...................... 438/50
7,545,017 B2 * 6/2009 Lee et al. ...................... 257/470
2004/0232802 A1 * 11/2004 Koshido ...................... 310/348
2005/0009315 A1 * 1/2005 Kim et al. ................... 438/613
2006/0131731 A1 * 6/2006 Sato ............................ 257/704
2006/0170110 A1 * 8/2006 Akram et al. ................ 257/774
2006/0192281 A1 * 8/2006 Lu et al. ...................... 257/704

* cited by examiner

*Primary Examiner*—Nitin Parekh
(74) *Attorney, Agent, or Firm*—Sughrue Mion, PLLC

(57) ABSTRACT

A cap wafer, fabrication method, and a semiconductor chip are provided. The cap wafer includes a cap wafer substrate; a penetrated electrode formed to penetrate the cap wafer substrate; and an electrode pad connected with a lower portion of the penetrated electrode on a lower surface of the cap wafer substrate, wherein the penetrated electrode has an oblique section which gradually widens from an upper surface to the lower surface of the cap wafer substrate. The fabrication method includes forming an oblique-via hole on a lower surface of a cap wafer substrate, the oblique-via hole having an oblique section which gradually narrows in a direction moving away from the lower surface of the cap wafer substrate; and forming a penetrated electrode in the oblique-via hole. The semiconductor chip includes a base wafer; a cap wafer; a cavity; a penetrated electrode; and a pad bonding layer.

9 Claims, 4 Drawing Sheets

CAP WAFER, SEMICONDUCTOR CHIP HAVING THE SAME, AND FABRICATION METHOD THEREOF

CROSS-REFERENCE TO RELATED PATENT APPLICATION

This application claims priority from Korean Patent Application No. 10-2006-0089815 filed on Sep. 15, 2006 in the Korean Intellectual Property Office, the entire disclosure of which is incorporated herein by reference.

BACKGROUND OF THE INVENTION

1. Field of the Invention

Apparatuses and methods consistent with the present invention relate to a cap wafer for packaging circuit elements formed on a base wafer, a semiconductor chip having the same, and a fabrication method thereof.

2. Description of the Related Art

Generally, a semiconductor chip, which is used in various electronic products, such as, for example, televisions, personal data assistants, mobile phones, etc., receives electric power from the outside to carry out a specific operation. Also, since the semiconductor chip has delicate electronic circuits built therein, it can be easily damaged by external impacts.

Accordingly, in fabrication, the semiconductor chip essentially requires a packaging process, which electrically connects the electronic circuits therein to the outside and at the same time, hermetically packages them to withstand external impacts, thereby allowing the semiconductor chip to have a physical function and shape.

As an example of techniques used in the packaging process, a wafer level packaging technique, which bonds a cap wafer having a shape to a base wafer in which circuit elements are formed, are known. The wafer level packaging technique is used as a packaging technique to satisfy reduced weight, decreased size and enhanced performance requirements of the electronic products, and is actively researched and developed in the semiconductor and micro electro mechanical system (MEMS) technology areas.

However, due to a demand of reducing the electronic products in size according to the reduced weight, the decreased size and the enhanced performance thereof, the semiconductor chip fabricated using the wafer level packaging technique is designed so that penetrated electrodes formed in the cap wafer are maximally reduced in size. As a result, the penetrated electrodes are formed so that aspect ratios thereof are enlarged. If the aspect ratios of the penetrated electrodes come large, it is not easy to form straight-via holes for forming the penetrated electrodes during fabrication. Also, even though the straight-via holes are formed, it is difficult to deposit a seed layer on side surfaces of the straight-via holes, and to completely fill the straight-via holes with a conductive material due to a difference of plating speed between an upper surface of the cap wafer and the insides of the straight-via holes, and a difference of plating speed according to depths of the straight-via holes. As a result, gaps or voids may occur in the resultant penetrated electrodes. If the gaps occur, fine dusts may go into the semiconductor chip through the gaps. As a result, the chip may malfunction due to the dusts that came in through the gaps. Also, if the voids occur, impurities in the voids may be oxidized, and thereby the chip may malfunction or suffer damage in operation.

To address the above problems, as a method of reducing the semiconductor chip in size, a method of forming the penetrated electrodes in a cap wafer with a decreased thickness can be considered. In this case, however, there is a limit to how far the thickness of the cap wafer may be reduced. This is because, in order to increase productivity, a size of wafer for forming the cap wafer is gradually increasing. Thus, a thickness of wafer, which can be fabricated without resulting in a wafer damage in a chip fabrication, is restricted.

As another method of reducing the semiconductor chip in size, a method of joining a sufficiently thick cap wafer with a base wafer, thinning an upper surface of the cap wafer to reduce the thickness of the cap wafer and then forming the penetrated electrodes in the cap wafer, can be considered. In this case, the above problem that the wafer is damaged due to the decreased thickness in the chip fabrication may be addressed. However, a problem occurs in that circuit elements of the base wafer are often damaged in forming the penetrated electrodes. Also, the method does not simultaneously form the cap wafer and the base wafer, but should form the base wafer prior to forming the cap wafer. Accordingly, a problem occurs in that a chip fabrication time is lengthened.

Thus, it would be advantageous to have a new fabrication method of the semiconductor chip which does not generate the above problems, even though the penetrated electrodes are formed in a high aspect ratio or the thickness of the cap wafer is decreased to reduce the semiconductor chip in size.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

Accordingly, an aspect of the present invention is to provide a cap wafer in which penetrated electrodes have oblique sections, so that even though they are designed in a high aspect ratio to reduce a size of the semiconductor chip, the chip wafer may be easily and quickly fabricated, thereby reducing fabrication costs, and a semiconductor chip having the same, and a fabrication method thereof.

Another aspect of the present invention is to provide a cap wafer having a reduced thickness to decrease a size of the semiconductor chip, a semiconductor chip having the same, and a fabrication method thereof.

Still another aspect of the present invention is to provide a fabrication method of a cap wafer and a fabrication method of a semiconductor chip in which penetrated electrodes are formed in a cap wafer prior to bonding the cap wafer and a base wafer with each other, so that damage of circuit elements in the base wafer can be prevented from occurring in forming the penetrated electrode after the bond between the cap wafer and the base wafer, and also so the cap wafer and the base wafer can be simultaneously fabricated, thereby reducing a fabrication time.

Another aspect of the present invention is to provide a fabrication method of a semiconductor chip in which a cap wafer is thinned after bonding the cap wafer to a base wafer, so that the cap wafer can be fabricated using a sufficiently thick wafer, thereby preventing wafer damage from occurring in fabricating the cap wafer with a thin wafer.

Additional aspects of the invention will be set forth in part in the description which follows and, in part, will be obvious from the description, or may be learned by practice of the invention.

According to an aspect of the present invention, there is provided a cap wafer including a cap wafer substrate, at least one penetrated electrode formed to penetrate the cap wafer substrate, and at least one electrode pad connected with a lower portion of the penetrated electrode on a lower surface of the cap wafer substrate. The penetrated electrode has an oblique section which gradually widens from an upper surface to the lower surface of the cap wafer substrate.

The penetrated electrode may be completely filled in an oblique-via hole formed to penetrate the cap wafer substrate and to have an oblique section.

Alternatively, the cap wafer may further include a subsidiary cavity formed on the lower surface of the cap wafer substrate.

According to another aspect of the present invention, there is provided a fabrication method of a cap wafer, including forming at least one oblique-via hole on a lower surface of a cap wafer substrate, the oblique-via hole having an oblique section which gradually narrows in a direction moving away from the lower surface of the cap wafer substrate, and forming a penetrated electrode in the oblique-via hole.

At the forming the oblique-via hole, the oblique-via hole may be formed so as not to completely penetrate the cap wafer substrate. Also, the oblique-via hole may be formed by one of a dry etching, a wet etching, a sand blasting, and a laser drilling.

The forming the penetrated electrode may be carried out by forming a seed layer on an entire area of the lower surface of the cap wafer substrate on which the oblique-via hole is formed, plating an entire area of the one surface of the cap wafer substrate on which the seed layer is formed, and polishing the surface of the cap wafer substrate.

Further, the fabrication method may further include forming at least one electrode pad coming in contact with the penetrated electrode on the surface of the cap wafer substrate after the forming the penetrated electrode.

Also, alternatively, the fabrication method may further include forming a subsidiary cavity on the surface of the cap wafer substrate after the forming the penetrated electrode.

According to still another aspect of the present invention, there is provided a semiconductor chip, including a base wafer which has at least one circuit element on an upper surface thereof, a cap wafer which is bonded with the base wafer to package the circuit element, a cavity which is located between the circuit element and a lower surface of the cap wafer, at least one penetrated electrode which is formed to penetrate the cap wafer and has an oblique section which gradually widens from an upper surface to the lower surface of the cap wafer, and at least one pad bonding layer which electrically couples the penetrated electrode to the circuit element.

The penetrated electrode may be completely filled in an oblique-via hole formed to penetrate a cap wafer substrate of the cap wafer and to have the oblique section.

The cavity may be a space set by the pad bonding layer between the cap wafer and the base wafer. Alternatively, the cavity may further include a subsidiary cavity comprising a recess formed on a lower surface of a cap wafer substrate of the cap wafer.

According to other aspect of the present invention, there is provided a fabrication method of a semiconductor chip, including: preparing a base wafer having at least one circuit element on a surface thereof, preparing a cap wafer having at least one penetrated electrode exposed to the outside through a surface thereof, bonding the surface of the base wafer and the surface of the cap wafer with each other, and thinning another surface of the cap, wafer to expose the penetrated electrode to the outside therethrough.

The preparing the cap wafer may be carried out by forming at least one oblique-via hole with an oblique section on a surface of a cap wafer substrate of the cap wafer, and forming a penetrated electrode in the oblique-via hole.

The forming the oblique-via hole may be carried out by forming an oblique-via hole having an oblique section which gradually narrows in a direction moving away from the surface of the cap wafer substrate. The oblique-via hole may be formed so as not to completely penetrate the cap wafer substrate. Also, the oblique-via hole may be formed by one of a dry etching, a wet etching, a sand blasting, and a laser drilling.

The forming the penetrated electrode may be carried out by forming a seed layer on an entire area of the surface of the cap wafer substrate on which the oblique-via hole is formed, plating an entire area of the surface of the cap wafer substrate on which the seed layer is formed, and polishing the surface of the cap wafer substrate.

The preparing the cap wafer may further include forming at least one electrode pad which comes in contact with the penetrated electrode on the surface of the cap wafer substrate after the forming the penetrated electrode.

Also, the preparing the cap wafer may further include forming a subsidiary cavity on the surface of the cap wafer substrate after the forming the-Penetrated electrode.

The bonding the surface of the base wafer and the surface of the cap wafer may be carried out by bonding the surface of the base wafer and the surface of the cap wafer with each other by using at least one pad bonding layer and at least one sealing layer, the pad bonding layer electrically coupling the penetrated electrode to the circuit element and the sealing layer closing up a cavity between the base wafer and the cap wafer.

The fabrication method may further include forming at least one electrode pad which couples the penetrated electrode to an outside on another surface of the cap wafer after the thinning the other surface of the cap wafer.

BRIEF DESCRIPTION OF THE DRAWINGS

The above aspects of the present invention will be more apparent from the description of exemplary embodiments of the present invention taken with reference to the accompanying drawings, in which.

Throughout the drawings, the same drawing reference numerals will be understood to refer to the same elements, features, and structures.

DETAILED DESCRIPTION OF EXEMPLARY EMBODIMENTS OF THE INVENTION

Reference will now be made in detail to exemplary embodiments of the present invention, which are illustrated in the accompanying drawings.

Figure 1:
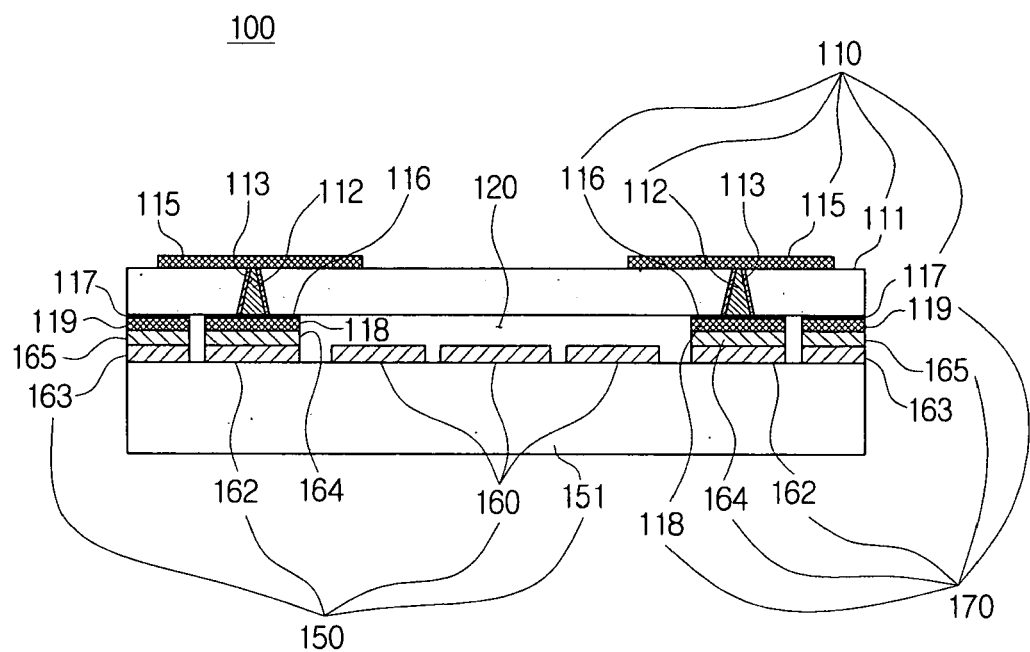
FIG. 1 is a cross-sectional view exemplifying a semiconductor chip in accordance with an exemplary embodiment of the present invention.

FIG. 1 is a cross-sectional view exemplifying a semiconductor chip to which a cap wafer in accordance with an exemplary embodiment of the present invention is applied.

Referring to FIG. 1, the semiconductor chip 100 in accordance with an exemplary embodiment of the present invention includes a base wafer 150, a cap wafer 110, a cavity 120, and a bonding part 170.

The base wafer 150 has circuit elements formed in the middle of an upper surface of a base wafer substrate 151.

Electrode pads 162 are disposed on both sides of circuit elements 160, and are electrically coupled with leads (not illustrated) of the circuit elements 160. The electrode pads 162 are formed so as to correspond to a number of leads of the circuit elements 160.

First sealing pads 163 are formed on the base wafer substrate 151 outside the electrode pads 162. Each of the first sealing pads 163 acts as a gasket for sealing the circuit elements when the cap wafer 110 and the base wafer 150 are bonded with each other.

The electrode pads 162 and the first sealing pads 163 are formed of the same conductive material.

The cap wafer 110, which is bonded with the base wafer 150 to package the circuit elements 160, includes a cap wafer substrate 111, penetrated electrodes 112, upper electrode pads 115, lower electrode pads 116, and second sealing pads 117.

The cap wafer substrate 111 may be formed of silicon, high resistivity silicon, ceramic, single crystal ceramic, glass, or the like.

The penetrated electrodes 112 are formed so that they penetrate the cap wafer substrate 111 over the electrode pads 162 of the base wafer 150, respectively. Each of the penetrated electrodes 112 has an oblique section, which gradually widens from an upper surface to a lower surface of the cap wafer substrate 111. Such penetrated electrodes 112 can be formed in a method which processes or machines one surface, that is, a lower surface, of the cap wafer substrate 111 with a dry etching process, a wet etching process, a sand blasting process, or a laser drilling process to form the sloped or oblique-via holes 113, and then fills the oblique-via holes 113 with conductive material through a plating process, which will be described below with reference to FIGS. 2A through 2D.

The penetrated electrodes 112 are formed to have the oblique section in order that in a case of the oblique-via holes 113, the plating process of depositing a seed metal and filling the oblique-via holes 113 with a conductive material in forming the penetrated electrodes 112 is more easy performed as compared with related art straight-via holes. That is, the oblique-via holes 113 can form the penetrated electrodes 112 without generating defects, such as gaps or voids in the plating process. Also, the oblique-via holes 113 have a processing or machining amount, and/or a processing or machining time smaller than that of the straight-via holes. Accordingly, a working time can be reduced and thus fabrication costs can be reduced.

Also, the penetrated electrodes 112 are formed according to a number of the electrode pads 162 of the base wafer 150, that is, the number that corresponds to the number of the leads of the circuit elements 160.

The upper electrode pads 115 are formed on upper parts of the penetrated electrodes 112, and are electrically coupled with an outer circuit (not shown).

The lower electrode pads 116 are formed on under parts of the penetrated electrodes 112, and are electrically coupled with leads of the circuit elements 160 through first and second pad bonding layers 164 and 118 of the bonding part 170 to be described layer and with the electrode pads 162 of the base wafer 150.

The second sealing pads 117 are formed on a lower surface of the cap wafer substrate 111 outside the lower electrode pads 116. Like the first sealing pads 163 of the base wafer 150, each of the second sealing pads 117 acts as a gasket for sealing the circuit elements 160 when the cap wafer 110 and the base wafer 150 are bonded with each other.

The lower electrode pads 116 and the second sealing pads 117 are formed of a same material.

The cavity 120 provides a room in which the circuit elements 160 formed on the upper surface of the base wafer substrate 151 can be operated, and is a space defined by the lower electrode pads 116 of the cap wafer 110 and the first and the second pad bonding layers 164 and 118 of the bonding part 170 between the cap wafer 110 and the base wafer 150. Accordingly, a depth of the cavity 120 is determined by a thicknesses of the lower electrode pads 116 and the first and the second pad bonding layers 164 and 118.

Figure 3:
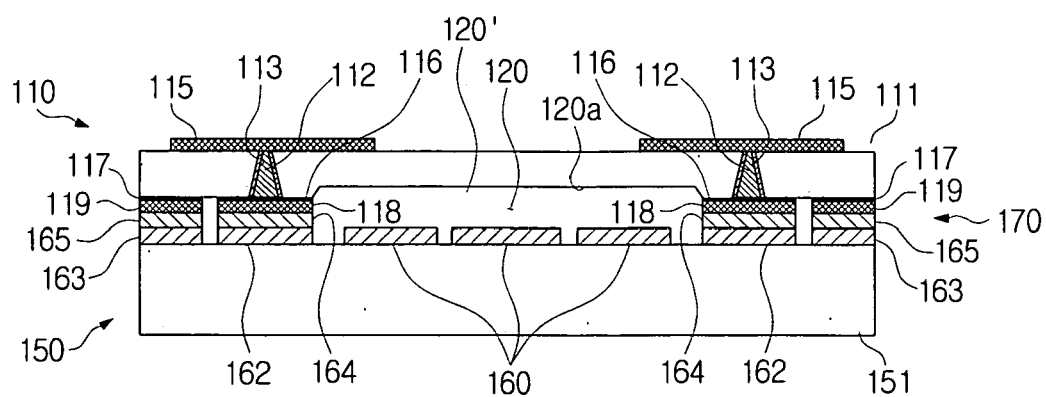
FIG. 3 is a cross-sectional view exemplifying a semiconductor chip in accordance with another exemplary embodiment of the present invention.

If the thicknesses of the lower electrode pads 116 and the first and the second pad bonding layers 164 and 118 is too small to provide room in which the circuit elements 160 can be smoothly operated, the cavity 120 can be configured to further include a subsidiary cavity 120' (see FIG. 3). The subsidiary cavity 120' may be made up of a recess 120a, which is formed in a certain depth and a certain area on the lower surface of the cap wafer substrate 111 so as to face the elements 160.

The bonding part 170, which bonds the cap wafer substrate 111 and the base wafer substrate 151 with each other, includes first and second pad bonding layers 164 and 118, and first and second sealing layers 165 and 119.

The first and the second pad bonding layers 164 and 118 are disposed on the electrode pads 162 of the base wafer 150 and the lower electrode pads 116 of the cap wafer 110, respectively, to electrically couple therebetween. A material, which is usable as the first and the second pad bonding layers 164 and 118, may be Au, Sn, In, Pb, Ag, Bi, Zn, Cu, or the like, or a compound thereof (for example, AuSn, or InSn).

The first and the second sealing layers 165 and 119 are disposed on the first sealing pads 163 of the base wafer 150 and the second sealing pads 117 of the cap wafer 110, respectively, and act to close up the cavity 120 in the bond between the cap wafer 110 and the base wafer 150. The first and the second sealing layers 165 and 119 can be formed of a same material as that of the first and the second pad bonding layers 164 and 118.

Accordingly, to package the base wafer 150 with the cap wafer 110, when a proper temperature and a proper pressure are applied to the first and the second pad bonding layers 164 and 118 and the first and the second sealing layers 165 and 119, the first and the second pad bonding layers 164 and 118 and the first and the second sealing layers 165 and 119 are bonded by reacting to each other, respectively. As a result, the cap wafer 110 and the base wafer 150 are bonded with each other, and thereby the semiconductor chip 110 in which the circuit elements 110 is packaged is fabricated.

As described above, the cap wafer 110 of the semiconductor chip 100 according to an exemplary embodiment of the present invention has penetrated electrodes 112 with an oblique section. Accordingly, the oblique-via holes 113 can be used when the penetrated electrodes 112 are formed. Thus, even though the penetrated electrodes 112 are formed in a high aspect ratio to reduce the semiconductor chip 100 in size, the oblique-via holes 113 can be easily formed, and a plating process for filling in the oblique-via holes 113 can be quickly carried out without generating defects, such as gaps or voids.

Figure 2A:
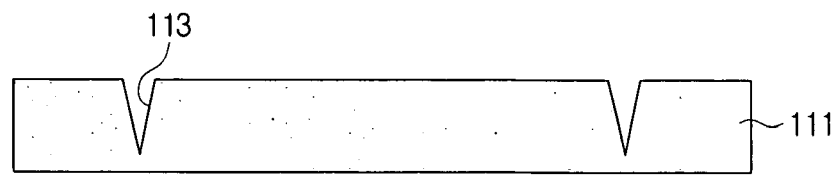
FIGS. 2A through 2G are cross-sectional views exemplifying a fabrication method of the semiconductor chip illustrated in FIG. 1.

Hereinafter, a fabrication process of a semiconductor chip 100 constructed as described above will be described in details with reference to FIGS. 1 through 2G.

A cap wafer substrate 111, which has a thickness larger than that of a cap wafer 110 to be finally formed, is prepared. Subsequently, as illustrated in FIG. 2A, oblique-via holes 113 are formed on a surface of the cap wafer substrate 111, which will form a lower surface of the cap wafer 110, by a dry etching method, a wet etching method, a sand blasting method, a laser drilling method, or the like. The oblique-via holes 113 are formed to have a wedge-shaped oblique section, which is gradually narrowed from the one surface to another surface (that is, from a lower surface to an upper surface) of the cap wafer substrate 111, and not to completely penetrate the cap wafer substrate 111.

Figure 2B:
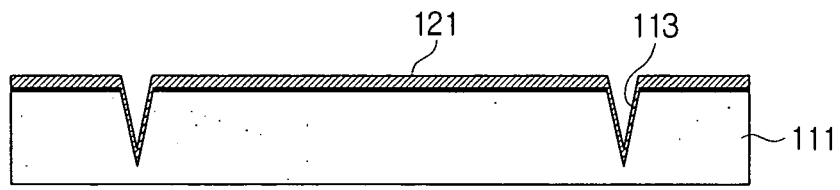

As illustrated in FIG. 2B, a seed later 121 is formed on an entire area of the surface of the cap wafer substrate 111 on which the oblique-via holes 113 are formed. The seed layer 121, which acts as a seed in a plating process to be described later, is made up of a conductive material, such as a metal.

Figure 2C:
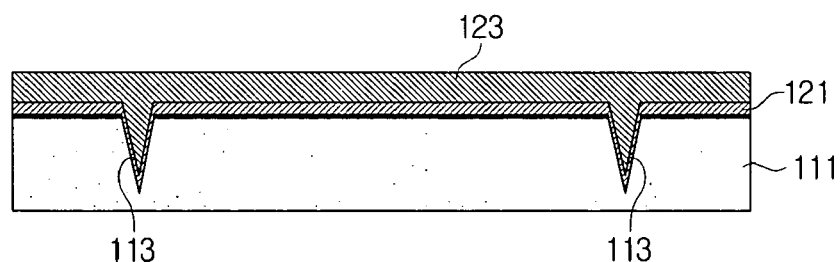

The surface of the cap wafer substrate 111 is exposed to a plating solution. As a result, as illustrated in FIG. 2C, a conductive substance is plated on the seed layer 121 to form a plated layer 123, which fills in the oblique-via holes 113.

Figure 2D:
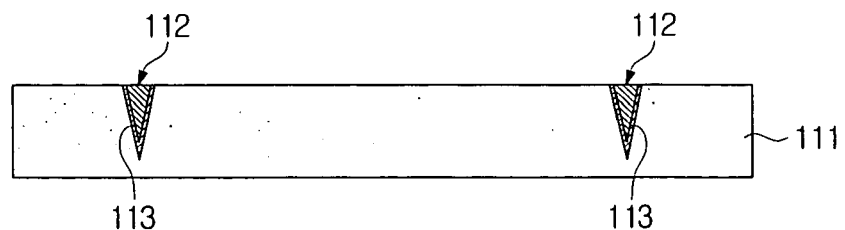

The seed layer 121 and the plated layer 123 formed on the surface of the cap wafer substrate 111 are polished and removed. As a result, as illustrated in FIG. 2D, only portions of the seed layer 121 and the plated layer 123 which fills in the oblique-via holes 113, that is, penetrated electrodes 112 of the cap wafer 110, remain on the surface of the cap wafer substrate 111.

To form lower electrode pads 116, second sealing pads 117, second pad bonding layers 118 and second sealing layers 119, a first electrode layer (not illustrated) and a first sealing layer (not illustrated) are formed in turn on the surface of the cap wafer substrate 111. The first electrode layer can be formed of a conductive material, such as a metal, and the sealing layer can be formed of Au, Sn, In, Pb, Ag, Bi, Zn, Cu, or the like, or a compound thereof (for example, AuSn or InSn).

Figure 2E:
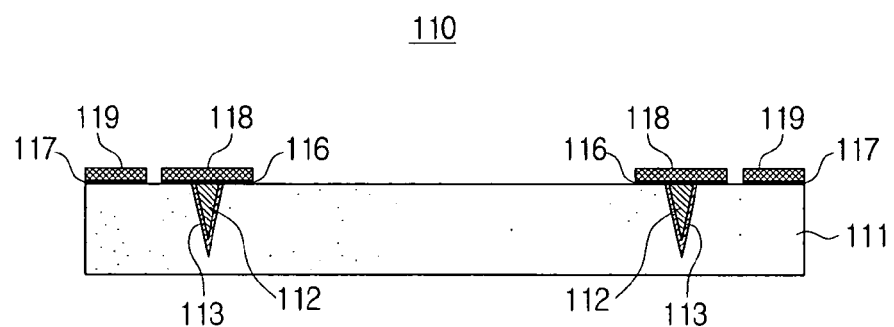

The first electrode layer and the sealing layer are etched in a pattern. The pattern may be predetermined. As a result, as illustrated in FIG. 2E, the lower electrode pads 116, the second sealing pads 117, the second pad bonding layers 118 and the second sealing layers 119 are formed on the surface of the cap wafer substrate 111.

When a base wafer 150 is packaged with the cap wafer 110 later, a thickness of the lower electrode pads 116 or the second sealing pads 117 and the second pad bonding layers 118 or the second sealing layers 119 sets a depth of a cavity 120 in which the circuit elements 160 can operate, together with a thickness of first bonding layers 164 or first sealing layers 165 of a base wafer 160. Thus, if the sum of the thicknesses of the lower electrode pads 116 or the second sealing pads 117 and the second pad bonding layers 118 or the second sealing layers 119 and the thickness of first bonding layers 164 or first sealing layers 165 is smaller than the depth of the cavity 120 needed for smoothly operating the circuit elements 160, it is advantageous if a subsidiary cavity 120' is formed to increase the depth of the cavity 120. The subsidiary cavity 120' can be formed by a dry etching method, a wet etching method, a san blasting method, a laser drilling method, or the like, after the penetrated electrodes 112 of the cap wafer 110 (FIG. 2C) are formed, or when the first electrode layer and the sealing layer are etched in the pattern to form the lower electrode pads 116, the second sealing pads 117, the second pad bonding layers 118 and the second sealing layers 119. The subsidiary cavity 102' may be a recess 120a, which is formed in to a certain depth and a certain area on the one surface of the cap wafer substrate 111 to face the circuit elements 160.

Figure 2F:
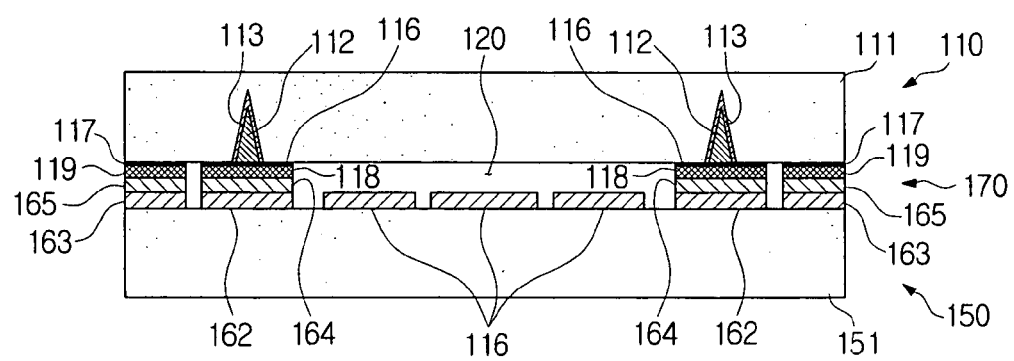
Figure 2G:
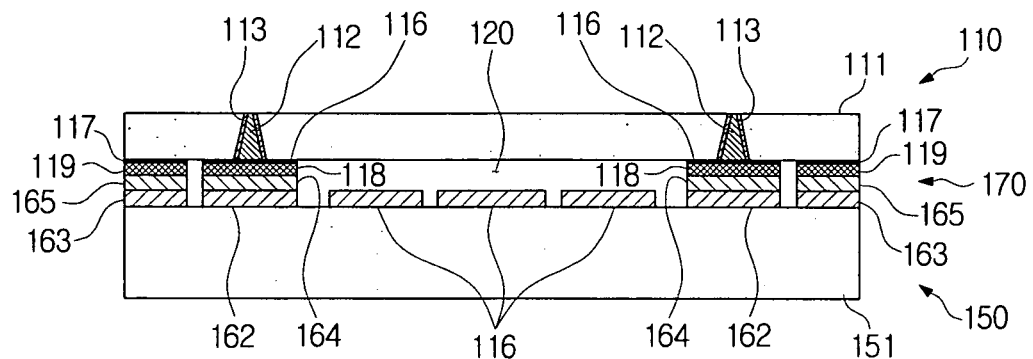

As illustrated in FIG. 2F, the cap wafer substrate 110 is disposed, so that the second pad bonding layers 118 and the second sealing layers 119 face the first pad bonding layers 164 and the first sealing layers 165 of the separately formed base wafer 150. Subsequently, the second pad bonding layers 118 and the second sealing layers 119 are bonded with the first pad bonding layers 164 and the first sealing layers 165, respectively. The bonding method can use a method of applying a temperature and a pressure.

The other surface, that is, an upper surface, of the cap wafer substrate 111 is thinned through a polishing process or an etching process. As a result, as illustrated in FIG. 2G, top parts of the penetrated electrodes 112 are exposed to the outside.

As described above, the cap wafer 110 according to exemplary embodiments of the present invention are formed by thinning the cap wafer substrate 111 with a thickness thicker than that thereof to be finally formed after it is bonded to the base wafer 150 in a state that the penetrated electrodes 112 are formed therein. Accordingly, the cap wafer 110 can be formed to have a reduced thickness without generating wafer damage which may occur in fabricating the cap wafer with a thin wafer. Also, damage of the circuit elements in the base wafer which occur in forming the penetrated electrodes after the bond between the cap wafer and the base wafer can be prevented.

To form upper electrode pads 115 to be connected to an outer circuit, a second electrode layer (not illustrated) is formed on the upper surface of the cap wafer substrate 111. The second electrode layer can be formed of a conductive material.

The second electrode layer is etched in a pattern. As a result, as illustrated in FIG. 1, the upper electrode pads 115 are formed on the upper surface of the cap wafer substrate 111, and the fabrication process of the semiconductor chip 100 is completed.

As apparent from the foregoing description, according to exemplary embodiments of the present invention, the cap wafer, the semiconductor chip having the same and a fabrication method thereof form the penetrated electrodes using the oblique-via holes. Accordingly, even though the penetrated electrodes are formed in the high aspect ratio to reduce the semiconductor chip in size, the via holes can be easily formed. Also, the plating process for filling in the via holes can be quickly carried out without generating defects, such as the gaps or the voids. Thus, a fabrication yield is increased and the fabrication costs are reduced.

Further, the cap wafer, the semiconductor chip having the same and the fabrication method thereof according to exemplary embodiments of the present invention reduce the thickness of the cap wafer by thinning the cap wafer. Accordingly, the semiconductor chip, which is finally formed, can be decreased in size.

Also, the cap wafer, the semiconductor chip having the same and the fabrication method thereof according to exemplary embodiments of the present invention form the penetrated electrodes prior to bonding the cap wafer and the base wafer with each other. Accordingly, damage of the circuit elements in the base wafer which may occur in forming the penetrated electrode after the bond between the cap wafer and the base wafer can be prevented. The cap wafer and the base wafer can be simultaneously fabricated going side by side, thereby reducing a fabrication time.

Moreover, the cap wafer, the semiconductor chip having the same and the fabrication method thereof according to exemplary embodiments of the present invention thin the cap wafer after bonding the cap wafer to the base wafer. Accordingly, the cap wafer can be fabricated using the sufficiently thick wafer, thereby preventing wafer damage which may occur in fabricating the cap wafer with the thin wafer.

Although exemplary embodiments of the present invention have been shown and described, it will be appreciated by those skilled in the art that changes may be made in these exemplary embodiments without departing from the principles and spirit of the invention, the scope of which is defined in the claims and their equivalents.

What is claimed is:

1. A cap wafer for packaging at least one circuit element formed on a base wafer comprising:

a cap wafer substrate;

at least one penetrated electrode formed to penetrate the cap wafer substrate; and at least one first electrode pad connected with a lower portion of the penetrated electrode on a lower surface of the cap wafer substrate for electrically coupling the penetrated electrode to the circuit element, wherein the penetrated electrode has an oblique section which gradually widens from an upper surface to the lower surface of the cap wafer substrate, and wherein the at least one penetrated electrode is formed to expose an upper portion thereof to the outside while penetrating the cap wafer substrate by thinning the upper surface of the cap wafer substrate in which the at least one penetrated electrode is formed when the cap wafer substrate and the base wafer are in a bonded state.

2. The cap wafer as claimed in claim 1, wherein the penetrated electrode is completely filled in an oblique-via hole formed to penetrate the cap wafer substrate and to have an oblique section.

3. The cap wafer as claimed in claim 1, further comprising a subsidiary cavity formed on the lower surface of the cap wafer substrate.

4. The cap wafer as claimed in claim 1, further comprising at least one second electrode pad formed on the thinned upper surface of the cap wafer substrate and a thinned upper portion of the penetrated electrode to connect the at least one second electrode pad to the thinned upper portion.

5. A semiconductor chip comprising:

a base wafer which has at least one circuit element on an upper surface thereof;

a cap wafer which bonds with the base wafer to package the circuit element;

a cavity which is located between the circuit element and a lower surface of the cap wafer;

at least one penetrated electrode which is formed to penetrate the cap wafer and has an oblique section which gradually widens from an upper surface to the lower surface of the cap wafer; and at least one pad bonding layer which electrically couples the penetrated electrode to the circuit elements, wherein the at least one penetrated electrode is formed to expose upper portion thereof to the outside while penetrating the cap wafer by thinning the upper surface of the cap wafer in which the at least one penetrated electrode is formed when the cap wafer and the base wafer are in a bonded state.

6. The semiconductor chip as claimed in claim 5, wherein the penetrated electrode is completely filled in an oblique-via hole formed to penetrate a cap wafer substrate of the cap wafer and to have an oblique section.

7. The semiconductor chip as claimed in claim 5, wherein the cavity comprises a space defined by the pad bonding layer between the cap wafer and the base wafer.

8. The semiconductor chip as claimed in claim 7, wherein the cavity further comprises a subsidiary cavity comprising a recess formed on a lower surface of a cap wafer substrate of the cap wafer.

9. The semiconductor chip as claimed in claim 5, further comprising at least one electrode pad layer formed on the thinned upper surface of the cap wafer and a thinned upper portion of the penetrated electrode to connect the at least one electrode pad layer to the thinned upper portion.

* * * * *